(12) United States Patent
Cho

(10) Patent No.: US 10,288,922 B2
(45) Date of Patent: May 14, 2019

(54) ROLLABLE DISPLAY DEVICE

(71) Applicant: LG Display Co., Ltd., Seoul (KR)

(72) Inventor: SeokHyo Cho, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/053,390

(22) Filed: Aug. 2, 2018

(65) Prior Publication Data
US 2019/0064578 A1 Feb. 28, 2019

(30) Foreign Application Priority Data

Aug. 30, 2017 (KR) .................. 10-2017-0110311

(51) Int. Cl.
| | |
|---|---|
| G06F 1/16 | (2006.01) |
| G02F 1/1333 | (2006.01) |
| H01L 51/00 | (2006.01) |
| H01L 51/52 | (2006.01) |

(52) U.S. Cl.
CPC .. *G02F 1/133308* (2013.01); *G02F 1/133305* (2013.01); *H01L 51/0097* (2013.01); *H01L 51/5237* (2013.01); *H01L 2251/5338* (2013.01)

(58) Field of Classification Search
CPC ......... G02F 1/133308; G02F 1/133305; H01L 51/0097; H01L 51/5237; H01L 2251/5338; G06F 1/1652; G06F 2203/04102; G09F 9/301; H04M 1/0268
See application file for complete search history.

(56) References Cited

U.S. PATENT DOCUMENTS

| | | | | |
|---|---|---|---|---|
| 9,098,241 | B1* | 8/2015 | Cho | ................. H05K 1/028 |
| 9,823,700 | B2* | 11/2017 | Lee | ................. G06F 1/1652 |
| 10,143,096 | B2* | 11/2018 | Park | ................. G06F 1/1652 |
| 10,146,260 | B2* | 12/2018 | Lee | ................. G06F 1/1652 |
| 2015/0340004 | A1* | 11/2015 | Pang | ................. G09G 5/00 345/205 |
| 2016/0187929 | A1* | 6/2016 | Kim | ................. G06F 1/1652 345/184 |

* cited by examiner

*Primary Examiner* — James Wu
*Assistant Examiner* — Hung Q Dang
(74) *Attorney, Agent, or Firm* — Seed Intellectual Property Law Group LLP

(57) ABSTRACT

A rollable display device includes a roller having a cylindrical shape and an outer circumferential surface on which a display panel is rolled. A cylinder member supports rotation of the roller, using a rotation support member coupled thereto. A housing member is rotatable together with the roller. A torsional elastic member is fixed to the cylinder member and the housing member. A housing inner member is provided on an inner circumferential surface of the housing member, such that impurities are attached thereto. Noise is prevented from being generated by impurities due to friction during operations, and impurities are prevented from moving outwardly.

12 Claims, 10 Drawing Sheets

ROLLABLE DISPLAY DEVICE

CROSS REFERENCE TO RELATED APPLICATION

This application claims priority to Korean Patent Application No. 10-2017-0110311, filed on Aug. 30, 2017, which is hereby incorporated by reference for all purposes as if fully set forth herein.

BACKGROUND

Technical Field

One or more embodiments relate to a display device and, more particularly, to a rollable display device in which a display panel can be rolled or unrolled like a scroll.

Description of the Related Art

In general, research into flat panel display devices, such as liquid crystal display (LCD) devices, plasma display devices, field emission display devices, and organic light-emitting display devices, has been actively undertaken. Among such flat panel display devices, LCD devices and organic light-emitting display devices have recently come to prominence, due to advantages thereof, such as adaptability to mass production, easy implementation of driving units, as well as the realization of high resolution.

Recently, research into, and development of, rollable and foldable display devices has been particularly required, in terms of technical aspects for overcoming the technical drawbacks of flat display devices, as well as structures able to have higher consumer appeal. A rollable display device of the related art, illustrated in FIG. 1, includes a display panel 110 and a roller 120, on which the display panel 110 is rolled.

However, in such a rollable display device, a separate power source, such as a motor, is required to roll the display panel. In addition, the rollable display device has other drawbacks, such as a complicated structure and an increased number of components.

In addition, impurities, created by the friction of operating components during a rolling operation of the display panel, may penetrate or move into spaces between the operating components, thereby generating noise, or may move outwardly to degrade the aesthetic quality of an external appearance, which is problematic.

Accordingly, research into a rollable display device in which the above-described problems are prevented is necessary.

BRIEF SUMMARY

In various embodiments, the present disclosure provides a rollable display device in which a display panel can be rolled or unrolled like a scroll, due to the elastic resilience of a torsional elastic member.

Also provided is a rollable display device that can prevent noise from being generated when impurities, created due to friction during the rolling operation of a display panel, penetrate or move into spaces between operating components, and prevent impurities from moving outwardly, which would otherwise degrade the aesthetic quality of an outer appearance.

The object of the present disclosure is not limited to the aforementioned description, and other objects not explicitly disclosed herein will be clearly understood by a person skilled in the art to which the present disclosure pertains from the description provided hereinafter.

According to an embodiment of the present disclosure, a rollable display device may include: a cylindrical roller having an outer circumferential surface on which a display panel is rolled; a cylinder member supporting rotation of the roller, using a rotation support member coupled thereto; a housing member rotatable together with the roller; a torsional elastic member fixed to the cylinder member and the housing member; and a housing inner member provided on an inner circumferential surface of the housing member, such that impurities are attached thereto. Noise is prevented from being generated by impurities due to friction during operations, and impurities are prevented from moving outwardly.

In the rollable display device according to one or more embodiments, the display panel can be rolled or unrolled like a scroll, due to the elastic resilience of the torsional elastic member.

In addition, in the rollable display device according to one or more embodiments, noise can be prevented from being generated when impurities, created due to friction during the rolling operation of a display panel, penetrate or move into spaces between operating components, and impurities can be prevented from moving outwardly, which would otherwise degrade the aesthetic quality of an outer appearance.

BRIEF DESCRIPTION OF THE SEVERAL VIEWS OF THE DRAWINGS

The above and other objects, features, and advantages of the present disclosure will be more clearly understood from the following detailed description when taken in conjunction with the accompanying drawings, in which.

DETAILED DESCRIPTION

Figure 1:
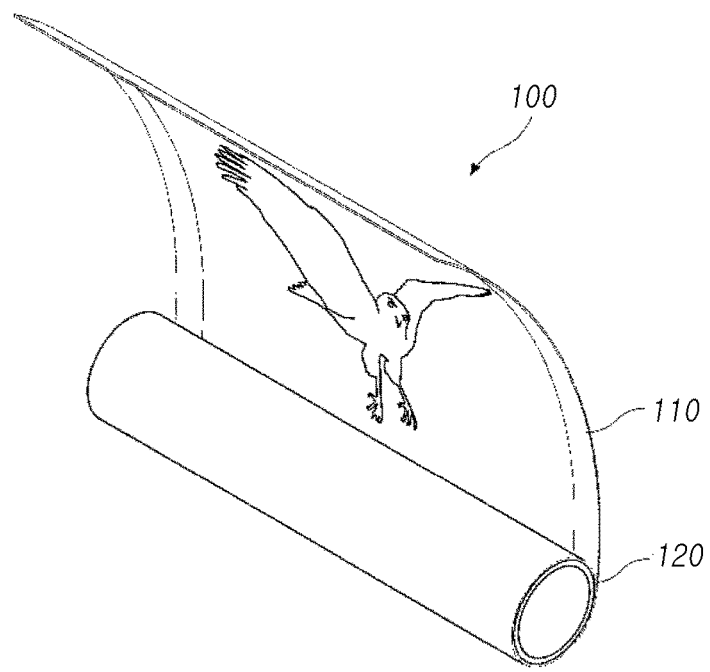
FIG. 1 is a perspective view schematically illustrating a rollable display device of the related art.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

Figure 2:
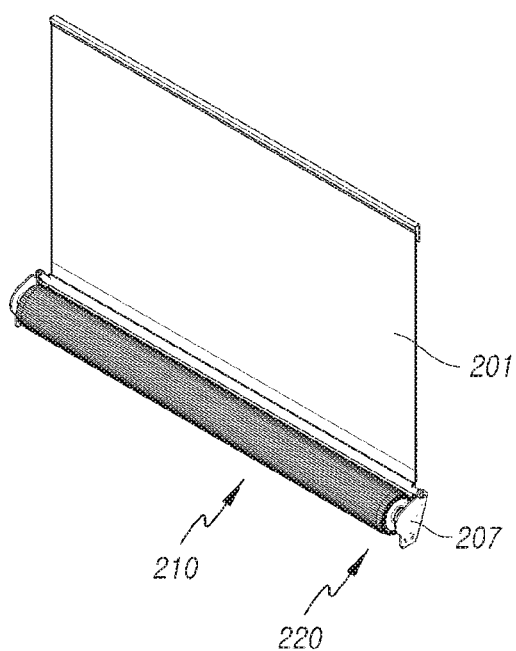
FIG. 2 is a perspective view schematically illustrating a rollable display device according to one or more embodiments.
Figure 3:
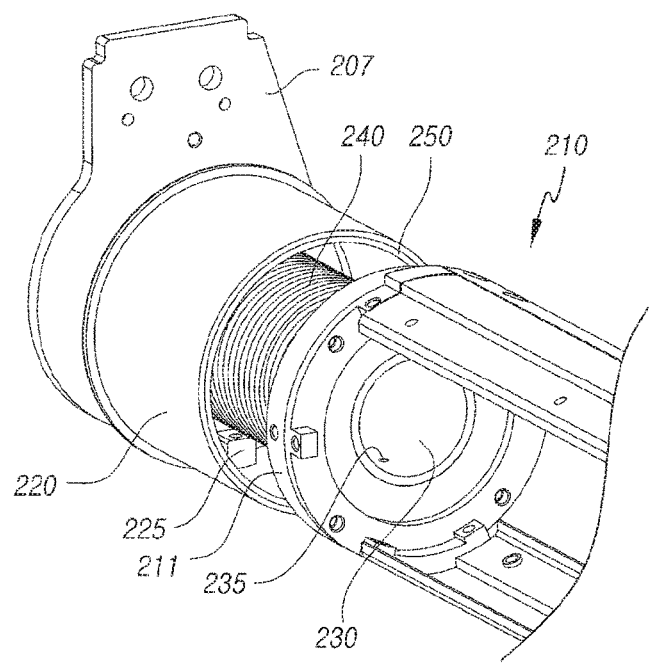
FIG. 3 is a partially-cutaway perspective view illustrating portions of the rollable display device according to one or more embodiments.
Figure 4:
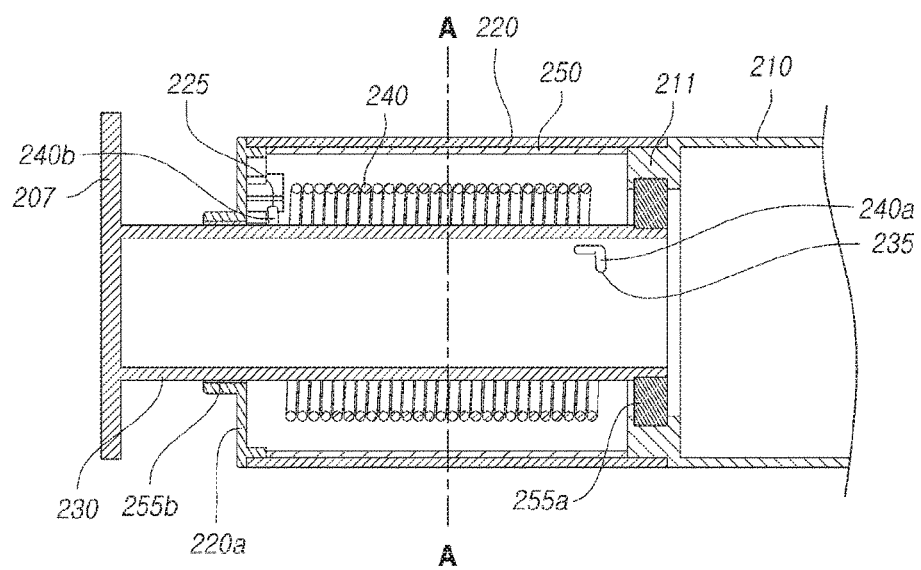
FIG. 4 is a cross-sectional view illustrating portions of the rollable display device according to one or more embodiments.
Figure 5:
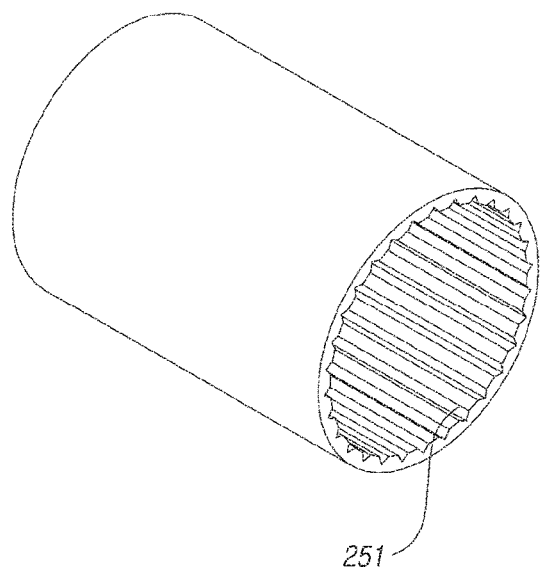
FIG. 5 is a perspective view illustrating portions of the rollable display device according to one or more embodiments.
Figure 6:
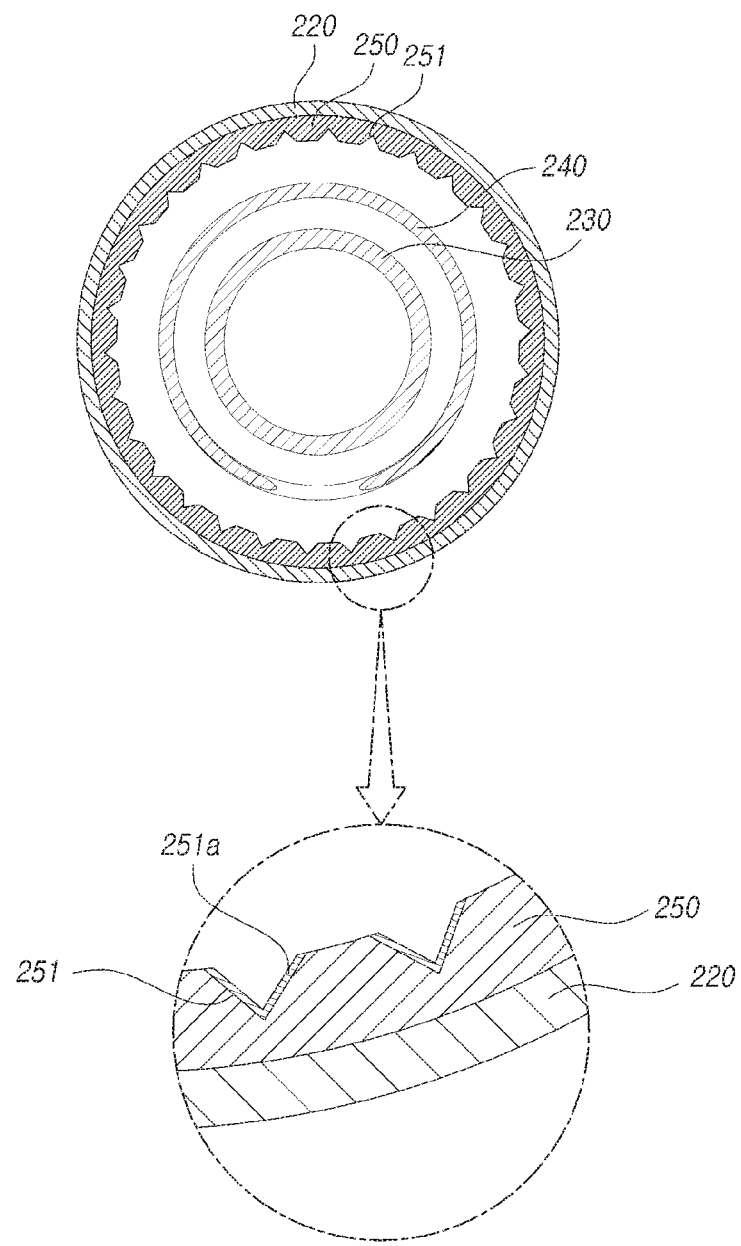
FIG. 6 is a cross-sectional view taken along line A-A in FIG. 4.
Figure 7:
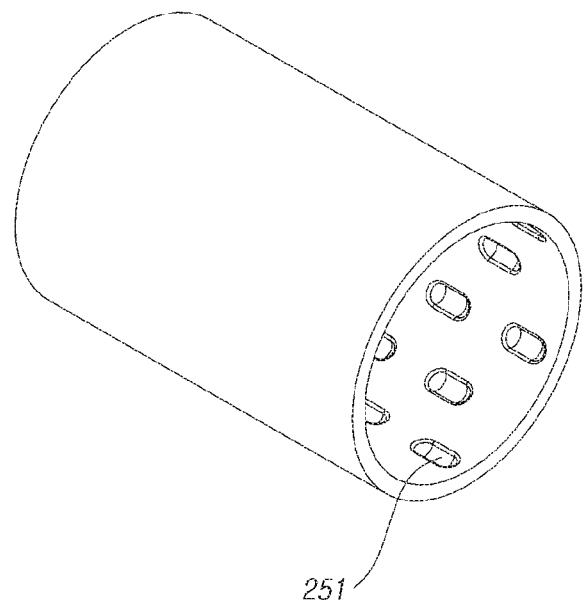
FIG. 7 is a perspective view illustrating portions of the rollable display device according to one or more embodiments.
Figure 8:
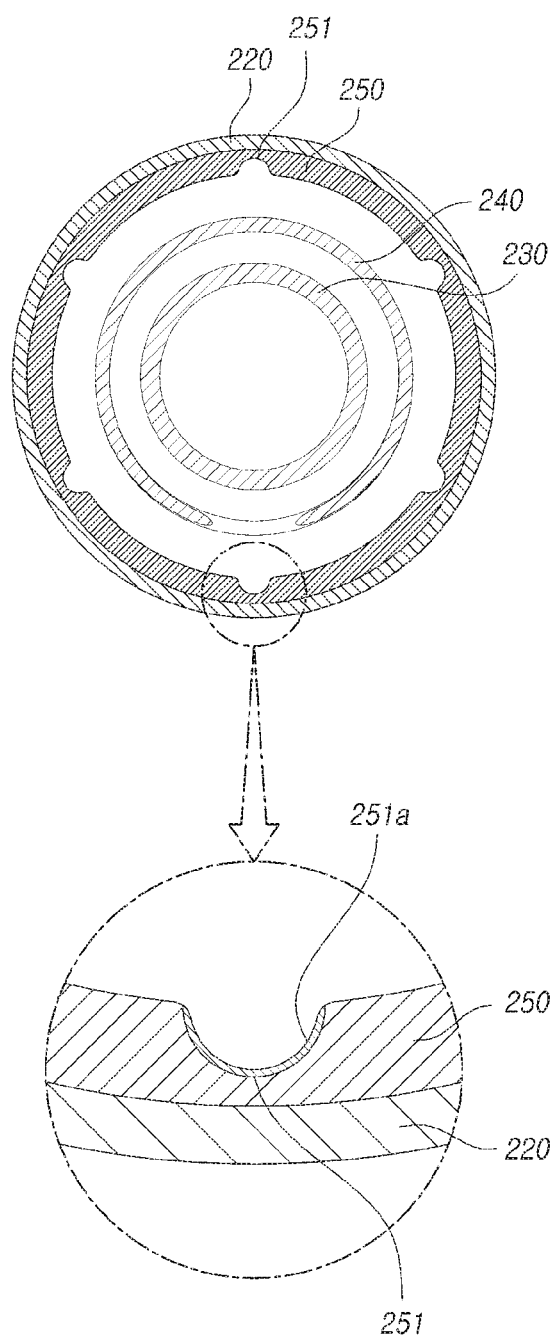
FIG. 8 is a cross-sectional view illustrating portions of the rollable display device according to one or more embodiments.
Figure 9:
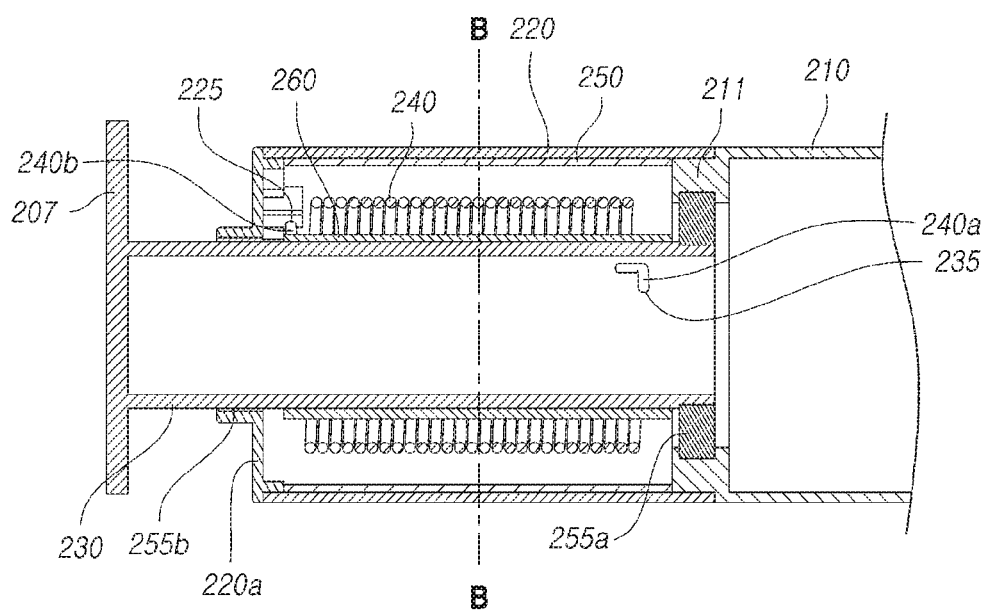
FIG. 9 is a cross-sectional view illustrating portions of the rollable display device according to one or more embodiments.
Figure 10:
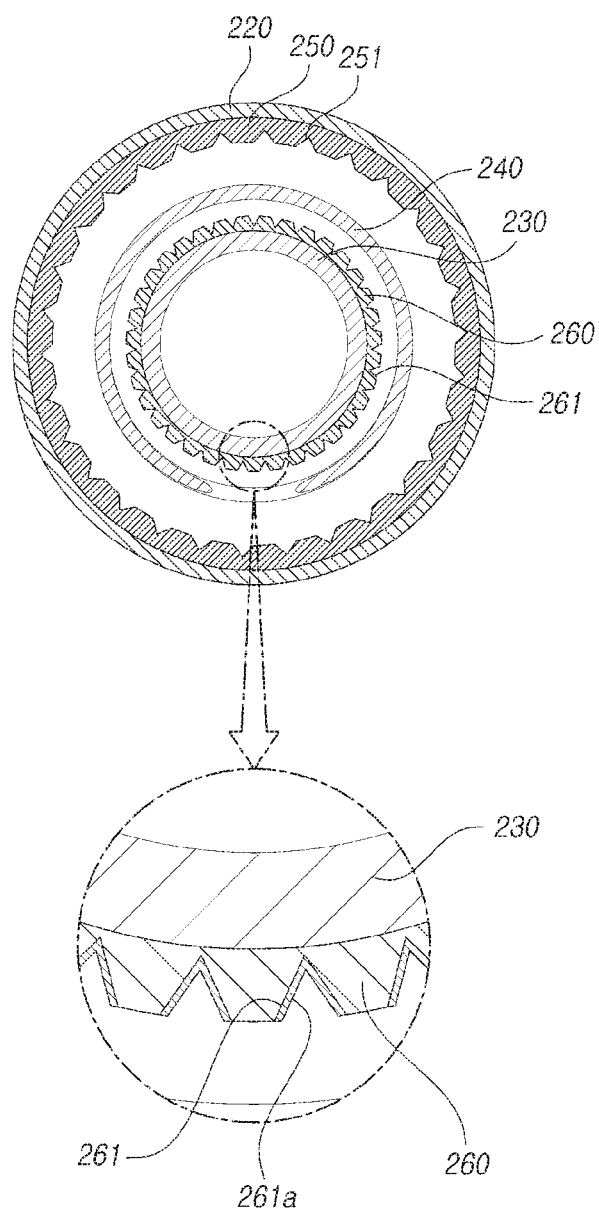
FIG. 10 is a cross-sectional view taken along line B-B in FIG. 9.

FIG. 2 is a perspective view schematically illustrating a rollable display device according to one or more embodiments, FIG. 3 is a partially-cutaway perspective view illustrating portions of the rollable display device according to one or more embodiments, FIG. 4 is a cross-sectional view illustrating portions of the rollable display device according to one or more embodiments, FIG. 5 is a perspective view illustrating portions of the rollable display device according to one or more embodiments, FIG. 6 is a cross-sectional view taken along line A-A in FIG. 5, FIG. 7 is a perspective view illustrating portions of the rollable display device according to one or more embodiments, FIG. 8 is a cross-sectional view illustrating portions of the rollable display device according to one or more embodiments, FIG. 9 is a cross-sectional view illustrating portions of the rollable display device according to one or more embodiments, and FIG. 10 is a cross-sectional view taken along line B-B in FIG. 9.

As illustrated in the drawings, a rollable display device 200 according to one or more embodiments includes a cylindrical roller 210, a cylinder member 230, a housing member 220, a torsional elastic member 240, and a housing inner member 250. The roller 210 is configured such that a display panel 201 is rolled on the outer circumferential surface thereof, and has an end connector 211 on one end thereof (or end connectors 211 on both ends thereof). The cylinder member 230 supports the rotation of the roller 210, using a rotation support member 255a coupled between the outer circumferential surface of one end of the cylinder member 230 and the inner circumferential surface of the end connector 211 of the roller 211. In the housing member 220, one end thereof is coupled to the outer circumferential surface of the end connector 211, and the other end thereof has a cylinder support 220a accommodating and supporting the other end of the cylinder member 230, such that the housing member 220 is rotatable together with the roller 210. The torsional elastic member 240 is disposed between the cylinder member 230 and the housing member 220, such that one end thereof is fixed to the cylinder member 230 and the other end thereof is fixed to the housing member 220. The housing inner member 250 is provided on the inner circumferential surface of the housing member 220, such that impurities can be attached thereto.

The rollable display device 200 having the above-described configuration, according to one or more embodiments, can provide a rollable display, in which the display panel 201 can be rolled and unrolled by elastic resilience, like a scroll, without a separate power source, such as a motor. The housing inner member 250, provided on the inner circumferential surface of the housing member 220, can cause impurities to be attached thereto, thereby preventing noise from being generated by impurities due to friction during operations and preventing impurities from moving outwardly.

The display panel 201 according to one or more embodiments is a flexible display panel able to provide the rollable display device 200.

In addition, the display panel 201 for providing the rollable display, according to one or more embodiments, is applicable regardless of being a liquid crystal display (LCD) panel or a light-emitting display panel.

In the case that the display panel 201 is an LCD panel, the display panel 201 may further include a backlight unit illuminating the LCD panel, a bottom polarizer panel attached to a bottom substrate, and a top polarizer panel attached to the front surface of a top substrate. The bottom substrate and the top substrate may have a variety of specific configurations known in the art, depending on the driving mode of the LCD panel, such as twisted nematic (TN) mode, vertical alignment (VA) mode, in-plane switching (IPS) mode, and fringe field switching (FFS) mode.

In the case that the display panel 201 is a light-emitting display panel, the display panel 201 may include a top substrate including a plurality of light-emitting cells provided in areas defined by gate lines, data lines, and power (VDD) lines, respectively, and a top substrate facing and attached to the bottom substrate.

Each of the plurality of light-emitting cells provided on the bottom substrate may include: at least one switching transistor connected to a gate line and a data line; at least one driving transistor connected to a switching transistor and a power line; and a light-emitting device (e.g., an organic light-emitting diode (OLED)) emitting light in response to current controlled by the switching of the driving transistor. The top substrate may include a moisture absorbent material, or the like, to protect the light-emitting device from moisture or oxygen in the ambient air.

The top substrate may further include a light-emitting device connected to the driving transistor. In this case, the light-emitting device on the bottom substrate may be omitted.

According to one or more embodiments, the display panel 201 is illustrated by way of example as being a light-emitting display panel. Since the light-emitting display panel 201 is configured to irradiate light by itself, the backlight unit emitting light is not illustrated. Hereinafter, the display panel 201 will be described as being a light-emitting display panel.

An organic compound contained in an array of pixels of the light-emitting display panel may be deteriorated when exposed to moisture or oxygen. To prevent the problem of deteriorated pixels, an encapsulation member 201b may be bonded to the rear surface of the display panel 201 to seal the array of pixels.

A polarizer film 201a may be bonded to the front surface of the display panel 201.

In addition, to prevent light emitted by the array of pixels from leaking through the edges, a side seal member made of a polymer material having a black pigment added thereto may be provided on the edges of the display panel 201.

In addition, a plurality of flexible circuit films having driving integrated circuits (ICs) mounted thereon are electrically connected to the display panel 201 and a printed circuit board (PCB), on at least one portion of the rectangular rear surface of the display panel 201, adjacent to at least one edge of the display panel 201.

The plurality of flexible circuit films are attached to the display panel 201 and the PCB via a resin or the like by tape automated bonding (TAB). The plurality of flexible circuit films may be tape carrier packages (TCPs) or chip-on-flexible boards or chip-on-films (COFs).

Thus, the display panel 201 is electrically connected or joined to the PCB via the plurality of flexible circuit films. The PCB is electrically connected to the plurality of flexible circuit films to provide a variety of image display signals to the display panel 201.

The PCB is electrically connected to the plurality of flexible circuit films to provide a variety of image display signals to the display panel 201. Driving ICs or the like for controlling the driving of the display panel 201 are mounted on the PCB. According to one or more embodiments, a printed circuit board (PCB) is provided in the inner space of the roller 210, and the display panel 201 is rolled on or unrolled from the outer circumferential surface of the roller 210.

The cylindrical roller 210 is configured such that the display panel 201 is rolled on the outer circumferential surface thereof. The end connector 211, provided on either end of the cylindrical roller 210, is coupled to the cylinder member 230 and the housing member 220. The cylinder member 230 has the rotation support member 255a coupled between the outer circumferential surface of one end thereof and the inner circumferential surface of the end connector 211 of the roller 210.

The rotation support member 255a may be implemented as a ball bearing, a roll bearing, a pin bearing, a bushing, or the like.

One end of the housing member 220 is coupled to the outer circumferential surface of the end connector 211 of the roller 210, and the other end of the housing member 220 is provided with the cylinder support 220a accommodating and supporting the other end of the cylinder member 230, such that the housing member 220 is rotatable together with the roller 210 when the roller 210 rotates. The cylinder support 220a may be provided separately to be coupled to the housing member 220 or may be provided integrally with the housing member 220.

The torsional elastic member 240 is disposed between the cylinder member 230 and the housing member 220, so that torsional elasticity is generated by the rotation of the roller 210. One end 240a of the torsional elastic member 240 is fixed to the cylinder member 230, while the other end 240b of the torsional elastic member 240 is fixed to the housing member 220.

When the display panel 201 is unrolled, the roller 210 and the housing member 220, which are rotatably supported by the cylinder member 230, with a bracket 207 being fixed to a cabinet, a case, or the like, compress a torsional elastic member 240 in a rotational direction, thereby generating torsional elasticity. When the display panel 201 is rolled, the elastic resilience of the torsional elastic member 240 causes the display panel 201 to return to the original rolled position.

Accordingly, a user can view the screen of the display panel 201 by unrolling or spreading the display panel 201 by pulling the display panel 201. When the display panel 201 is unfixed, the display panel 201 can be rolled by the elastic resilience.

When the operation of rolling and unrolling the display panel 201 is performed, impurities, such as dust or powder, are produced due to friction between portions of the torsional elastic member 240. The housing inner member 250 is disposed on the inner circumferential surface of the housing member 220, and thus, can cause impurities to be attached thereto, thereby preventing noise from being generated by impurities or impurities from moving outwardly.

The housing inner member 250 may be made of a material causing impurities to be attached thereto and holding attached impurities. The material may be magnet or an adhesive material, such as silicone, rubber, or urethane, depending on the material of the torsional elastic member 240.

A second rotation support member 255b may be provided between the outer circumferential surface of the cylinder member 230 and the cylinder support 220a to reduce rotational friction between the cylinder support 220a of the housing member 220, which rotates together with the roller 210, and the cylinder member 230, thereby reducing noise and vibrations.

The second rotation support member 255b may be implemented as a ball bearing, a roll bearing, a pin bearing, a bushing, or the like, as described above.

In addition, a first holding portion 235 is provided on one side of the cylinder member 230 to hold one end 240a of the torsional elastic member 240, while a second holding portion 225 is provided on the other side of the housing member 220 to hold the other end 240b of the torsional elastic member 240, such that both ends 240a and 240b of the torsional elastic member 240 can be easily coupled to the cylinder member 230 and the housing member 220.

The torsional elastic member 240 may be implemented as a member acting as a type of torsion spring. One end of the torsional elastic member 240 is fixedly coupled to the cylinder member 230, which remains fixed instead of being rotatable, and the other end of the torsional elastic member 240 is fixedly coupled to the housing member 220, which is rotatable, such that torsional elasticity can be generated. The torsional elastic member 240 remains uncoupled from counterpart components during torsional compression due to rotation, thereby facilitating the fixing operation of a mechanic.

In this regard, a through-hole is provided in the cylinder member 230 or the housing members 220 or a holding-hole is provided in a protrusion of the cylinder member 230 or the housing members 220 to provide a holding structure in the cylinder member 230 or the housing member 220. According to one or more embodiments, the first holding portion 235 is illustrated, by way of example, as being a through-hole extending through the inner circumferential surface and the outer circumferential surface of the cylinder member 230, and the second holding portion 225 is illustrated, by way of example, as being a holding-hole provided in a protrusion of the inner circumferential surface of the housing member 220.

The housing inner member 250 has accommodation recesses 251 in the inner circumferential surface thereof, in which impurities are accumulated. This configuration can reduce the movement of impurities within the housing member 220 during the rotation of the housing member 220.

Accordingly, even in the case that impurities attached to the inner circumferential surface of the housing inner member 250 are driven to move, impurities can be accumulated in the accommodation recesses 251, thereby minimizing the amount of impurities moving.

The accommodation recesses 251 are elongated in the axial direction of the housing member 220. When impurities are detached from the inner circumferential surface of the housing inner member 250, the elongated accommodation recesses 251 can accommodate a sufficient amount of impurities accumulated therein.

In addition, as illustrated in FIGS. 5 and 6, the accommodation recesses 251 may be provided as a plurality of grooves spaced apart from each other in the circumferential direction of the housing member 220. Even in the case that a portion of impurities, accumulated in one accommodation recess 251, is driven to move by the rotation of the housing member 220, the portion of impurities can be accommodated in an adjacent accommodation recess 251, thereby minimizing the amount of impurities moving.

In addition, adhesive fixing portions 251a are provided on the surfaces of the housing inner member in the accommodation recesses 251, respectively, to hold impurities using the adhesion thereof, such that the ability of the accommodation recesses 251 to hold impurities can be improved.

Each of the adhesive fixing portions 251a may be implemented as double-sided tape disposed to expose one adhesive layer thereof, or may be provided by directly coating the surface of the accommodation recess 251 with an adhesive. Accordingly, the adhesive fixing portions 251a can fixedly hold impurities such that impurities are not detached therefrom.

In addition, as illustrated in FIG. 7, the accommodation recesses 251 may be provided as concave-shaped recesses having curved surfaces, in the inner circumferential surface of the housing inner member 250. This configuration allows impurities to be accumulated in a wider area.

Since the accommodation recesses 251 are provided as a plurality of recesses spaced apart from each other in a circumferential direction and an axial direction, even in the case that a portion of impurities, accumulated in one accommodation recess 251, is driven to move by the rotation of the housing member 220, the moved portion of impurities can be accommodated in an adjacent accommodation recess 251, thereby minimizing the amount of impurities moving.

In addition, even in the case that the accommodation recesses 251 are concave-shaped recesses having curved surfaces, adhesive fixing portions 251a may be provided on the surface of the accommodation recesses 251, respectively, as illustrated in FIG. 8, to hold impurities using the adhesion thereof, such that the ability of the accommodation recesses 251 to hold impurities can be improved.

In addition, as illustrated in FIGS. 9 and 10, a cylinder outer member 260 may be provided on the outer circumferential surface of the cylinder member 230, such that impurities can be attached thereto. Due to the cylinder outer member 260 being provided together with the housing inner member 250, impurities created by the friction of the torsional elastic member 240 can be attached to both the inner circumferential side and the outer circumferential side of the torsional elastic member 240, thereby minimizing the amount of impurities moving.

A plurality of accommodation recesses (or a single accommodation recess) 261 may be provided in the outer circumferential surface of the cylinder outer member 260, such that impurities can be accumulated therein. Adhesive fixing portions 261a are provided on the surfaces of the accommodation recesses 261 to fixedly hold impurities. This configuration can further increase the amount of impurities to be accumulated and improve the ability of the accommodation recesses 251 to hold impurities.

According to one or more embodiments, the display panel has been illustrated as being a light-emitting display panel in the drawings. However, as described above, one or more embodiments are applicable to LCD display panels. In this case, a backlight module illuminating the LCD panel includes a light source module, a lightguide plate processing light, emitted by the light source module, to be suitable for the LCD panel, a light adjustment member, a reflector, and the like. The light source module is a part converting electrical energy into light. The light source module may be implemented as one selected from among, but not limited to, a light-emitting diode (LED) assembly, a cold cathode fluorescent lamp (CCFL), and a hot cathode fluorescent lamp (HCFL). Since the light source module is well known in the art to which one or more embodiments belong, detailed descriptions thereof will be omitted.

In the rollable display device according to one or more embodiments, the display panel can be rolled or unrolled like a scroll, due to the elastic resilience of the torsional elastic member 240.

In addition, in the rollable display device according to one or more embodiments, noise can be prevented from being generated when impurities, created due to friction during the rolling operation of a display panel, penetrate or move into spaces between operating components, and impurities can be prevented from moving outwardly, which would otherwise degrade the aesthetic quality of an outer appearance.

Although all of the components constituting one or more embodiments have been described as being combined together or as operating in concert with each other, the present disclosure is not necessarily limited thereto. Rather, one or more components may be selected from the entire components to be combined together and operate in a combined form within the scope of the present disclosure.

It will be understood that the terms "comprise," "include," "have," and any variations thereof used herein are intended to cover non-exclusive inclusions unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A rollable display device, comprising:
a cylindrical roller having an outer circumferential surface on which a display panel is rolled, the roller having an end connector on an end thereof;
a cylinder member;
a rotation support member coupled between an outer circumferential surface of the cylinder member and an inner circumferential surface of the end connector of the roller;
a housing member having a first end coupled to an outer circumferential surface of the end connector, and a second end having a cylinder support accommodating and supporting the cylinder member, the housing member being rotatable together with the roller;
a torsional elastic member disposed between the cylinder member and the housing member, a first end of the torsional elastic member being fixed to the cylinder member and a second end of the torsional elastic member being fixed to the housing member; and
a housing inner member provided on an inner circumferential surface of the housing member.

2. The rollable display device according to claim 1, further comprising a second rotation support member between the outer circumferential surface of the cylinder member and the cylinder support.

3. The rollable display device according to claim 2, wherein the cylinder member includes a first holding portion which holds the first end of the torsional elastic member, and the housing member includes a second holding portion which holds the second end of the torsional elastic member.

4. The rollable display device according to claim 3, wherein the housing inner member includes an accommodation recess in an inner circumferential surface thereof, in which impurities are accumulated.

5. The rollable display device according to claim 4, wherein the accommodation recess is elongated in an axial direction of the housing member.

6. The rollable display device according to claim 5, wherein the accommodation recess comprises a plurality of accommodation recesses spaced apart from each other in a circumferential direction of the housing member.

7. The rollable display device according to claim 6, wherein adhesive fixing portions are provided on surfaces of the housing inner member in the plurality of accommodation recesses.

8. The rollable display device according to claim 4, wherein the accommodation recess comprises a concave-shaped recess having a curved surface.

9. The rollable display device according to claim 8, wherein the accommodation recess comprises a plurality of accommodation recesses spaced apart from each other in a circumferential direction and in an axial direction of the housing member.

10. The rollable display device according to claim 9, wherein adhesive fixing portions are provided on surfaces of the housing inner member in the plurality of accommodation recesses.

11. The rollable display device according to claim 3, further comprising a cylinder outer member provided on the outer circumferential surface of the cylinder member.

12. The rollable display device according to claim 11, wherein the cylinder outer member includes at least one accommodation recess in an outer circumferential surface thereof, in which impurities are accumulated, and an adhesive fixing portion provided on a surface of the cylinder outer member in the accommodation recess.

* * * * *